United States Patent
Uetani et al.

(10) Patent No.: US 9,935,253 B2
(45) Date of Patent: Apr. 3, 2018

(54) CERAMIC DEVICE AND PIEZOELECTRIC DEVICE

(71) Applicant: NGK INSULATORS, LTD., Nagoya (JP)

(72) Inventors: Masayuki Uetani, Kasugai (JP); Takaaki Koizumi, Tajimi (JP); Izumi Masuda, Kitanagoya (JP); Takeshi Kaku, Komaki (JP)

(73) Assignee: NGK Insulators, Ltd., Nagoya (JP)

( * ) Notice: Subject to any disclaimer, the term of this patent is extended or adjusted under 35 U.S.C. 154(b) by 287 days.

(21) Appl. No.: 14/969,313

(22) Filed: Dec. 15, 2015

(65) Prior Publication Data

US 2016/0099400 A1    Apr. 7, 2016

Related U.S. Application Data

(63) Continuation of application No. PCT/JP2014/065852, filed on Jun. 16, 2014.

(30) Foreign Application Priority Data

Jun. 24, 2013  (JP) ................. 2013-131242

(51) Int. Cl.
  *H01L 41/047* (2006.01)
  *H01L 41/083* (2006.01)
  *H01L 41/273* (2013.01)

(52) U.S. Cl.
  CPC ...... *H01L 41/0472* (2013.01); *H01L 41/0477* (2013.01); *H01L 41/083* (2013.01); *H01L 41/273* (2013.01)

(58) Field of Classification Search
  CPC ............. H01L 41/0472; H01L 41/0474; H01L 41/0477

(Continued)

(56) References Cited

U.S. PATENT DOCUMENTS

2012/0019981 A1*  1/2012  Yoshida ............... H01C 1/1406
                                                                361/321.1
2012/0319536 A1* 12/2012  Sakuratani ............ H01G 4/30
                                                                310/366

(Continued)

FOREIGN PATENT DOCUMENTS

JP   2006-237527 A1   9/2006
WO   2011/145453 A1  11/2011
WO   2012/132661 A1  10/2012

OTHER PUBLICATIONS

International Preliminary Report on Patentability (Application No. PCT/JP2014/065852) dated Jan. 7, 2016 (with English translation).

(Continued)

*Primary Examiner* — Bryan Gordon
(74) *Attorney, Agent, or Firm* — Burr & Brown, PLLC

(57) ABSTRACT

A piezoelectric device is a fired body including a body part 10 and external electrodes 21 and 22. A surface of the side electrode 22 is comprised only of a material for the side electrode 22. On a surface of the surface electrode 21 or a surface of a connection portion where the surface electrode 21 and the side electrode 22 are connected to each other, a protrusion h extending along a direction along which the connection portion extends and sticking out in a thickness direction of the surface electrode 21 is provided. A region, on the surface of the surface electrode 21, farther from the connection portion than the protrusion h is interspersed with a plurality of exposed portions in each of which a surface of a ceramic material having lower solder wettability than a material for the surface electrode 21 is exposed.

7 Claims, 17 Drawing Sheets

(58) Field of Classification Search
USPC .................................. 310/363, 364, 365, 366
See application file for complete search history.

(56) References Cited

U.S. PATENT DOCUMENTS

2013/0033154 A1* 2/2013 Sakuratani ............... H01G 4/30
                                                        310/366
2013/0069490 A1   3/2013 Nakamura et al.
2014/0375173 A1* 12/2014 Hamanaka .......... H01L 41/0472
                                                        310/363

OTHER PUBLICATIONS

International Search Report (Application No. PCT/JP2014/065852) dated Sep. 16, 2014.

* cited by examiner

F I G. 1
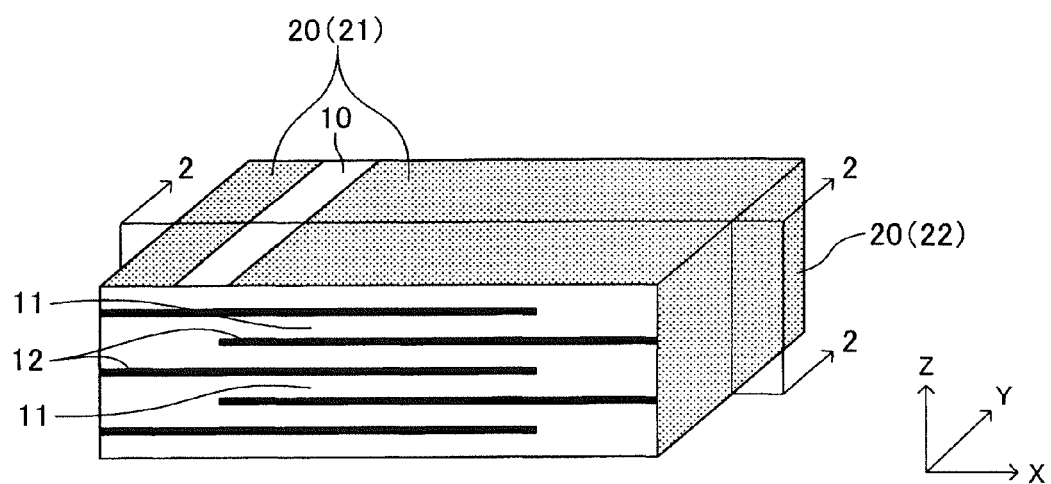

F I G. 7
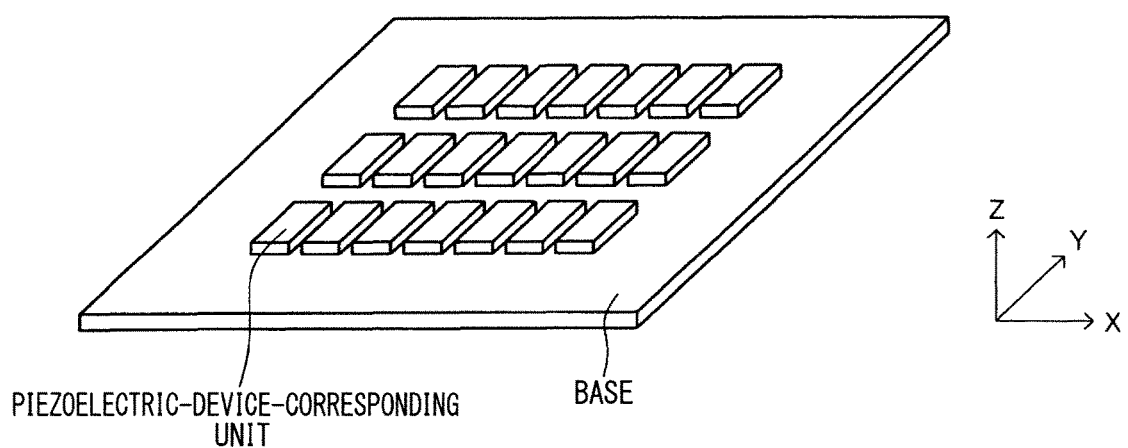
PIEZOELECTRIC-DEVICE-CORRESPONDING UNIT — BASE

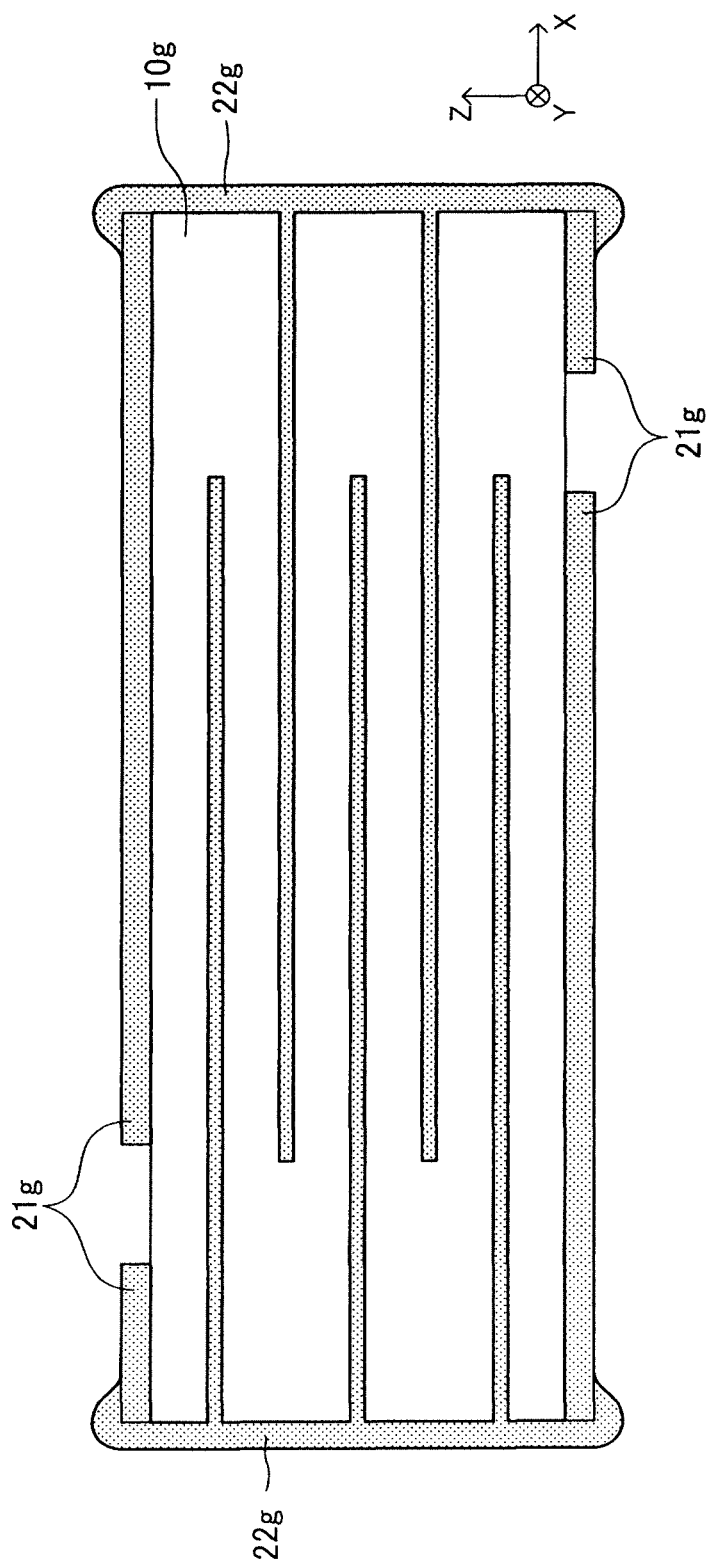

F I G. 1 0
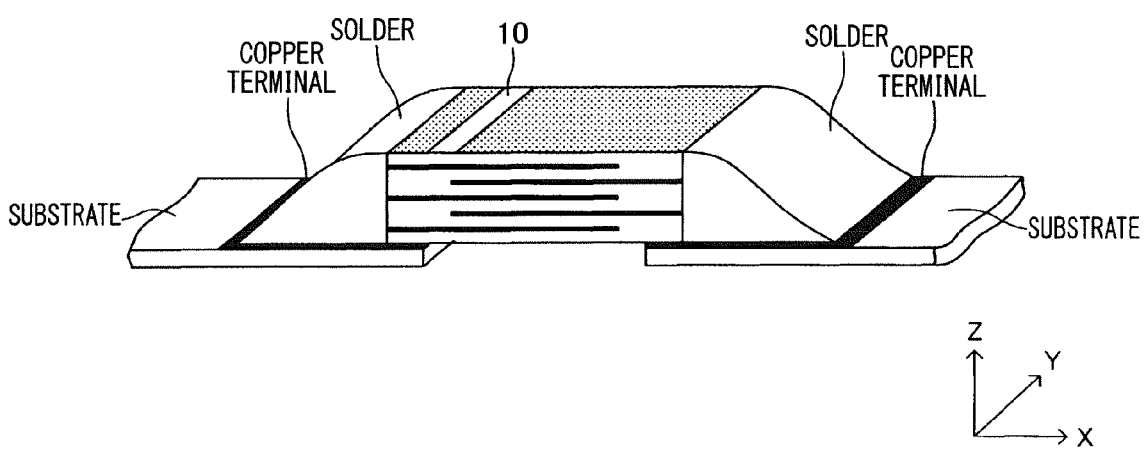

CERAMIC DEVICE AND PIEZOELECTRIC DEVICE

TECHNICAL FIELD

The present invention relates to ceramic devices and, in particular, to a piezoelectric device. The piezoelectric device is also referred to as a piezoelectric/electrostrictive device.

BACKGROUND ART

As an example of this type of piezoelectric device, WO 2012/132661 discloses a piezoelectric device that is a fired body including a body part 100 and an external electrode 200 as illustrated in FIG. 22. In the piezoelectric device illustrated in FIG. 22, the body part 100 is a stack of alternating piezoelectric layers 110 and internal electrodes 120. The external electrode 200 includes a pair of surface electrodes 210 covering parts of an upper surface of the body part 100, and a pair of side electrodes 220 covering at least parts of respective side surfaces of the body part 100 and being connected to the internal electrodes 120 and the surface electrodes 210 at respective sides.

This type of piezoelectric device has actively been developed as an element (e.g., an autofocus for cameras and an ultrasonic motor for zooming) for controlling the position of an optical lens, an element (e.g., an actuator for magnetic heads of hard disk drives) for controlling the position of an element for reading and/or writing magnetic information and the like, and a sensor for converting mechanical vibration into electrical signals, for example.

SUMMARY OF INVENTION

The piezoelectric device illustrated in FIG. 22 is sometimes assembled onto substrates with solder, for example, as illustrated in FIG. 23. In the example illustrated in FIG. 23, the pair of side electrodes 220 of the piezoelectric device are joined and secured to opposing ends of a pair of substrates located remotely from each other with solder with both ends of a lower surface of the piezoelectric device placed on upper surfaces of the ends of the pair of substrates.

In this case, when too much solder is used, for example, the solder can ride over upper end surfaces of the side electrodes 220, and enter surfaces (upper surfaces) of the surface electrodes 210 as shown by white arrows in FIG. 24. If such an event occurs, expansion and contraction of the surface electrodes 210 can be restricted at application of voltage to the piezoelectric device due to adherence of the solder to the surfaces of the surface electrodes 210, and this can adversely affect "voltage-displacement characteristics" of the piezoelectric device as a whole. Furthermore, if an excessive amount of solder enters the surfaces of the surface electrodes 210, the solder can enter a gap between the pair of surface electrodes 210, resulting in electrical short circuits of the pair of surface electrodes 210.

As described above, the state of the solder riding over the upper end surfaces of the side electrodes and entering the surfaces of the surface electrodes is not preferred because it leads to the adverse effects on the "voltage-displacement characteristics" of the piezoelectric device. The present invention aims to provide a ceramic device (piezoelectric device) that makes it difficult for solder to ride over upper end surfaces of side electrodes and enter surfaces of surface electrodes.

To achieve the above-mentioned aim, a ceramic device (piezoelectric device) according to the present invention is characterized in that a surface of a side electrode is comprised only of a material for the side electrode (Characteristic 1), on a surface of a surface electrode or a surface of a connection portion where the surface electrode and the side electrode are connected to each other, a protrusion extending along a direction along which the connection portion extends and sticking out in a thickness direction of the surface electrode is provided (Characteristic 2), and a "region, on the surface of the surface electrode, farther from the connection portion than the protrusion" (hereinafter, referred to as an "inner region") is interspersed with a plurality of exposed portions in each of which a surface of a ceramic material having lower wettability to a conductive joining material than a material for the surface electrode is exposed (Characteristic 3).

The ceramic material for the exposed portions is herein preferably a piezoelectric material having the same composition as the piezoelectric material contained in the body part. The surface electrode (and the side electrode) is preferably comprised of a platinum material, and the conductive joining material is preferably a solder material. Surfaces of the "exposed portions" may stick out or be recessed from the surface of the surface electrode. Recessed portions of the "exposed portions" may be portions in which the piezoelectric material contained in the body part is exposed. A surface of the protrusion is preferably comprised only of a material for the surface electrode (or the side electrode).

According to (Characteristic 1) described above, the surface of the side electrode is comprised only of the material (typically, platinum) for the side electrode having relatively high wettability to the conductive joining material (typically, solder), and thus the conductive joining material is likely to wet on the surface of the side electrode. Thus, when the side electrode is joined and secured to a substrate with the conductive joining material as described above, for example, adhesion and bondability of the conductive joining material to the side electrode increase, leading to an increase in reliability concerning electrical connection between the conductive joining material and the substrate.

According to (Characteristic 2) described above, when the side electrode is joined and secured to the substrate with the conductive joining material as described above, the conductive joining material is less likely to ride over an upper end surface of the side electrode, and enter the surface (an upper surface) of the surface electrode due to the presence of the protrusion.

According to (Characteristic 3) described above, if the conductive joining material rides over the upper end surface of the side electrode, and further rides over the protrusion to enter the "inner region" on the surface of the surface electrode, expansion of a range of wetting of the conductive joining material in the "inner region" can be suppressed by the presence of the "exposed portions" having lower wettability to the conductive joining material. As a result, the extent to which expansion and contraction of the surface electrode are restricted at application of voltage to the piezoelectric device can be suppressed, and the adverse effects on the "voltage-displacement characteristics" of the piezoelectric device as a whole can be suppressed.

The protrusion preferably has a height of 0.5 μm to 8.0 μm. When the surface electrode is viewed from a direction perpendicular to the surface of the surface electrode, a ratio of a total area of the plurality of exposed portions to a total area of the region, on the surface electrode, farther from the connection portion than the protrusion is preferably 10% to 40%. A ratio of a total area of a "region which is recessed from the surface of the surface electrode and in which the piezoelectric material contained in the body part is exposed" in the plurality of exposed portions to the total area of the region, on the surface electrode, farther from the connection portion than the protrusion is preferably 0% to 20%. Furthermore, when the surface electrode is viewed from a direction perpendicular to the surface of the surface electrode, an average equivalent diameter of each of the plurality of exposed portions is preferably 0.8 μm to 5.0 μm. These aspects are described in detail below.

The exposed portions may be portions in which ceramic particles fixed onto the surface of the surface electrode are exposed. The state of being "fixed" herein refers to the state of (particles of) an electrode material for the surface electrode and the ceramic particles being joined together directly or via glass. The state of the "ceramic particles being exposed from the surface of the surface electrode" refers to the state of at least parts of the ceramic particles being exposed from the surface of the surface electrode. It further refers to the state of the ceramic particles being disposed to stick out or be recessed from (the particles of) the electrode material on the surface of the surface electrode so that (the particles of) the electrode material and the ceramic particles form a rough surface of the external electrode.

The following three methods are considered as a method for fixing the ceramic particles onto the surface of the surface electrode.

1. A method of forming a shaped body of the surface electrode using paste of an electrode material containing the ceramic particles, and firing the formed shaped body.

2. A method of forming a shaped body of the surface electrode using paste of an electrode material not containing the ceramic particles, spraying the ceramic particles onto a surface of the formed shaped body, and firing the shaped body onto which the ceramic particles have been sprayed.

3. A method of forming a shaped body of the surface electrode using paste of an electrode material not containing the ceramic particles, firing the formed shaped body, and joining the ceramic material onto a surface of a fired body formed through firing using a glass joining method.

BRIEF DESCRIPTION OF DRAWINGS

FIG. 1 is a perspective view of a piezoelectric device according to an embodiment of the present invention.

FIG. 7 illustrates the state of the many piezoelectric-device-corresponding units being cut out on the base.

FIG. 9 is a second diagram illustrating the process of manufacturing the piezoelectric device illustrated in FIG. 1.

FIG. 10 illustrates the state of the piezoelectric device illustrated in FIG. 1 being assembled onto substrates with solder.

DESCRIPTION OF EMBODIMENT

An embodiment of a piezoelectric device according to the present invention is described below with reference to the drawings.

(Structure)

Figure 2:
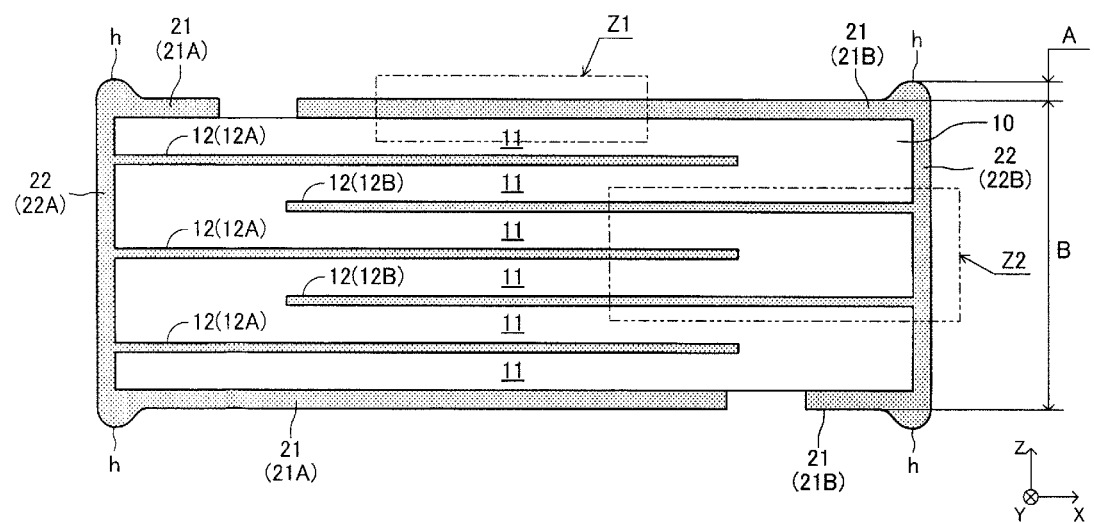
FIG. 2 is a cross sectional view of the piezoelectric device illustrated in FIG. 1 taken along the line 2-2 of FIG. 1.

As illustrated in FIG. 1 and FIG. 2, which is a cross sectional view taken along the line 2-2 of FIG. 1, a piezoelectric device according to the present embodiment is a fired body, and includes a rectangular parallelepiped body part 10 and an external electrode 20 provided on the body part 10 to cover at least part of a surface of the body part 10.

The body part 10 includes a plurality of (six in this example) piezoelectric layers 11 comprised of a piezoelectric material and a plurality of (five in this example) layered internal electrodes 12, and is a stack of alternating piezoelectric layers 11 and internal electrodes 12 having the piezoelectric layers 11 as an uppermost layer and a lowermost layer. The piezoelectric layers 11 and the internal electrodes 12 are stacked in parallel to each other. As for the size (after firing) of the body part 10, the body part 10 has a width (in the x-axis direction) of 0.2 mm to 10.0 mm, a depth (in the y-axis direction) of 0.1 mm to 10.0 mm, and a height (in the z-axis direction) of 0.01 mm to 10.0 mm, for example. Each of the piezoelectric layers 11 (after firing) has a thickness (in the z-axis direction) of 1.0 μm to 100.0 μm, and each of the internal electrodes 12 (after firing) has a thickness (in the z-axis direction) of 0.3 μm to 5.0 μm.

As illustrated in FIG. 2, the external electrode 20 includes surface electrodes 21 covering parts of an upper surface and a lower surface of the body part 10 and side electrodes 22 covering parts of side surfaces of the body part 10. The side electrodes 22 are electrically connected to the internal electrodes 12 and the surface electrodes 21. More specifically, (three) internal electrodes 12A, surface electrodes 21A, and a side electrode 22A (hereinafter, collectively referred to as a "first electrode group") are electrically connected to one another, and (two) internal electrodes 12B, surface electrodes 21B, and a side electrode 22B (hereinafter, collectively referred to as a "second electrode group") are electrically connected to one another.

The first and second electrode groups are electrically insulated from each other by being connected to each other with the piezoelectric layers 11, which are insulators, therebetween. In other words, the (three) electrically-connected internal electrodes 12A and the (two) electrically-connected internal electrodes 12B form an interdigitated electrode. The surface electrodes 21 (after calcination) each have a thickness of 0.5 μm to 10.0 μm, and the side electrodes 22 (after firing) each have a thickness of 0.5 μm to 10.0 μm. Although the number of internal electrodes is five in this example, the number of internal electrodes is not particularly limited (may be zero).

In the piezoelectric device, the amount of deformation of the piezoelectric layers 11 (i.e., the body part 10) can be controlled by adjusting a potential difference applied across the first and second electrode groups. By using this principle, the piezoelectric device can be used as an actuator for controlling the position of an object. Examples of the object include an optical lens, a magnetic head, and an optical head. In the piezoelectric device, a potential difference generated across the first and second electrode groups varies depending on the amount of deformation of the piezoelectric layers 11 (i.e., the body part 10). By using this principle, the piezoelectric device can be used as various sensors, including an ultrasonic sensor, an acceleration sensor, an angular velocity sensor, an impact sensor, and a mass sensor.

A material (piezoelectric material) for the piezoelectric layers 11 is preferably piezoelectric ceramic, electrostrictive ceramic, ferroelectric ceramic, or antiferroelectric ceramic. A specific example of the material includes ceramic containing lead zirconate, lead titanate, lead magnesium niobate, lead nickel niobate, lead zinc niobate, lead manganese niobate, lead antimony stannate, lead manganese tungstate, lead cobalt niobate, barium titanate, sodium bismuth titanate, potassium sodium niobate, strontium bismuth tantalate, and the like alone or as a mixture.

A material (an electrode material) for the external electrode 20 (the surface electrodes 21 and the side electrodes 22) and the internal electrodes 12 is preferably metal that is a solid at room temperature and has high conductivity, and is, for example, metal, such as aluminum, titanium, chromium, iron, cobalt, nickel, copper, zinc, niobium, molybdenum, ruthenium, palladium, rhodium, silver, tin, tantalum, tungsten, iridium, platinum, gold, and lead, alone or an alloy of these types of metal, or a material not solid-soluble with an insulating material.

As illustrated in FIG. 2, on surfaces of "connection portions" (four corner portions of the body part 10) where the surface electrodes 21 and the side electrodes 22 are connected to each other, protrusions h sticking out in the thickness direction (z-axis direction) of the surface electrodes 21 are provided. Each of the protrusions h extends along a direction (the y-axis direction) along which the "connection portions" extend. In the present embodiment, the protrusions h are comprised of the same material as the surface electrodes 21 and the side electrodes 22. The height A (see FIG. 2) of the protrusions h is described below.

Figure 3:
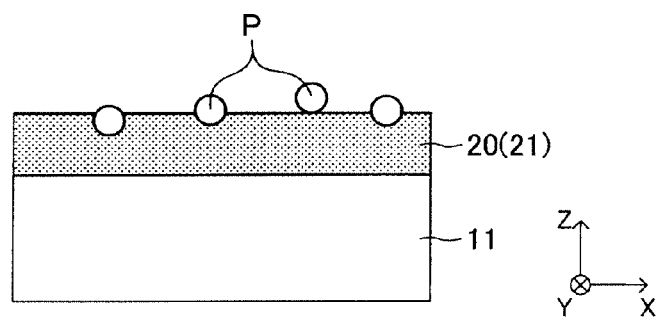
FIG. 3 is an enlarged view of a portion Z1 of FIG. 2.
Figure 4:
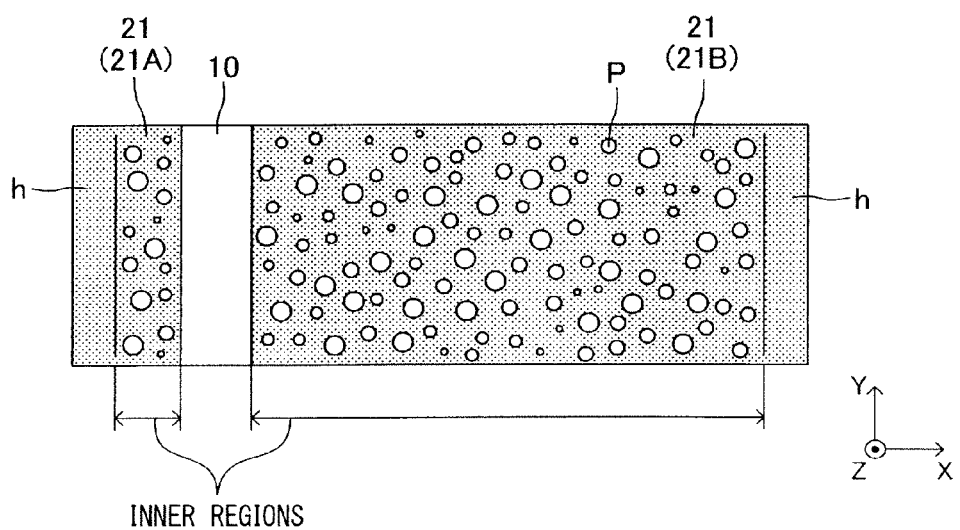
FIG. 4 is a top view of the piezoelectric device illustrated in FIG. 1.

As illustrated in FIG. 3, which is an enlarged view of a portion Z1 of FIG. 2, and FIG. 4, which is a top view of the piezoelectric device, "regions (hereinafter referred to as "inner regions", see FIG. 4) inside the protrusions h along the width direction (x-axis direction)" on the surfaces of the surface electrodes 21 are interspersed with a plurality of ceramic particles P sticking out and exposed from the surfaces of the surface electrodes 21. These ceramic particles P are fixed onto the surfaces of the surface electrodes 21. As illustrated in FIG. 4, surfaces of the protrusions h have no ceramic particles P.

In the present embodiment, particles of a piezoelectric material having the same composition as the piezoelectric material are used as the ceramic particles P. The state of being "fixed" refers to the state of particles of the electrode material for the surface electrodes 21 and the ceramic particles P being joined together directly or via glass. The state of the "ceramic particles P being exposed from the surfaces of the surface electrodes 21" refers to the state of at least parts of the ceramic particles P being viewed (through microscopic observation and the like) on the surfaces of the surface electrodes 21. In the present embodiment, the ceramic particles P are disposed to stick out from the particles of the electrode material on the surfaces in the "inner regions" of the surface electrodes 21. The particles of the electrode material and the ceramic particles P thus form a rough surface in the "inner regions" of the surface electrodes 21.

The ceramic particles P have lower wettability to "solder" than the material for the surface electrodes 21. It can thus be said that the "inner regions" on the surfaces of the surface electrodes 21 are interspersed with "portions (hereinafter, referred to as "exposed portions") in each of which a surface of a ceramic material having lower solder wettability than the material for the surface electrodes 21 is exposed".

Figure 5:
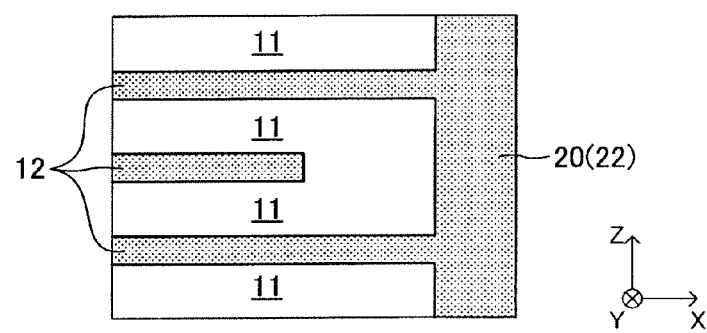
FIG. 5 is an enlarged view of a portion Z2 of FIG. 2.

On the other hand, as illustrated in FIG. 5, which is an enlarged view of a portion Z2 of FIG. 2, no ceramic particles P are disposed on the side electrodes 22 as with the above-mentioned protrusions h. It can thus be said that the surfaces of the side electrodes 22 are comprised only of the material for the side electrodes 22. A plurality of ceramic particles P may be buried in the side electrodes 22 as long as the surfaces of the side electrodes 22 are comprised only of the material for the side electrodes 22.

(Manufacturing Method)

A method for manufacturing the above-mentioned piezoelectric device is briefly described next. A method for causing the external electrode 20 to contain the ceramic particles P is described below. Any member "before firing" is hereinafter indicated by adding a term "green" to the name of the member, and by adding a letter "g" to the end of a reference sign of the member.

Figure 6:
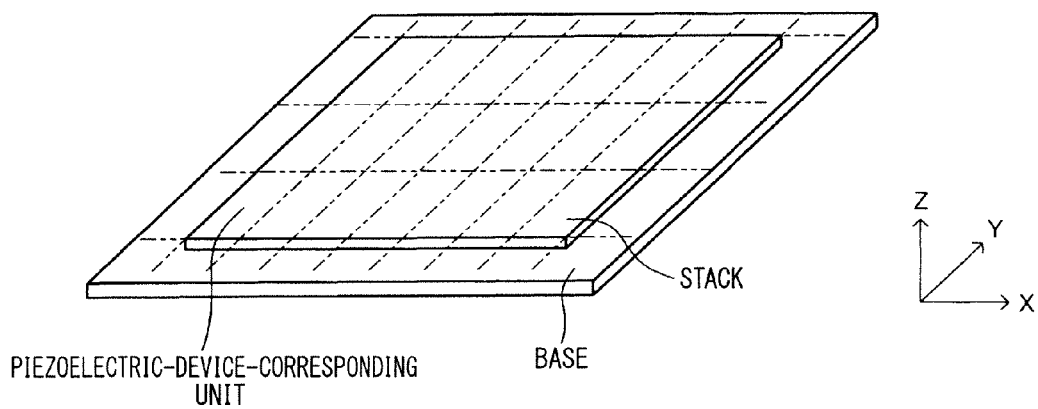
FIG. 6 illustrates how to cut many piezoelectric-device-corresponding units out of a large stack formed on a base in the same process.

In this example, as illustrated in FIG. 6, a single large green stack in which a plurality of (3×7) portions (hereinafter, referred to as "green piezoelectric-device-corresponding units") corresponding to piezoelectric devices are arranged in a matrix at predetermined intervals is first formed on a planar base. The large green stack includes a green stack part corresponding to the body part 10 and green electrode films formed on an upper surface and a lower surface of the green stack part and corresponding to the surface electrodes 21.

The green stack part corresponding to the body part 10 is formed by alternately stacking green piezoelectric sheets corresponding to the piezoelectric layers 11 and green electrode films corresponding to the internal electrodes 12. The green piezoelectric sheets are formed by shaping paste containing the piezoelectric material using one of known methods, such as a doctor blade method. The green electrode films are formed on the green piezoelectric sheets by shaping paste containing the electrode material using one of known methods, such as screen printing, spray coating, and ink jet. Green adhesive layers may be disposed between the green piezoelectric sheets and the green electrode films to ensure pressure-adhesion of the green electrode films to the green piezoelectric sheets. In this case, the green adhesive layers are formed on the green piezoelectric sheets using one of known methods, such as application.

Next, machining, such as cutting and punching, is performed along cutting plane lines (see alternate long and two short dashes lines) illustrated in FIG. 6. As a result, as illustrated in FIG. 7, the plurality of (3×7) green piezoelectric-device-corresponding units can be extracted on the base in the same process. Description is given below by focusing on only one of the plurality of extracted green piezoelectric-device-corresponding units for convenience's sake.

Figure 8:
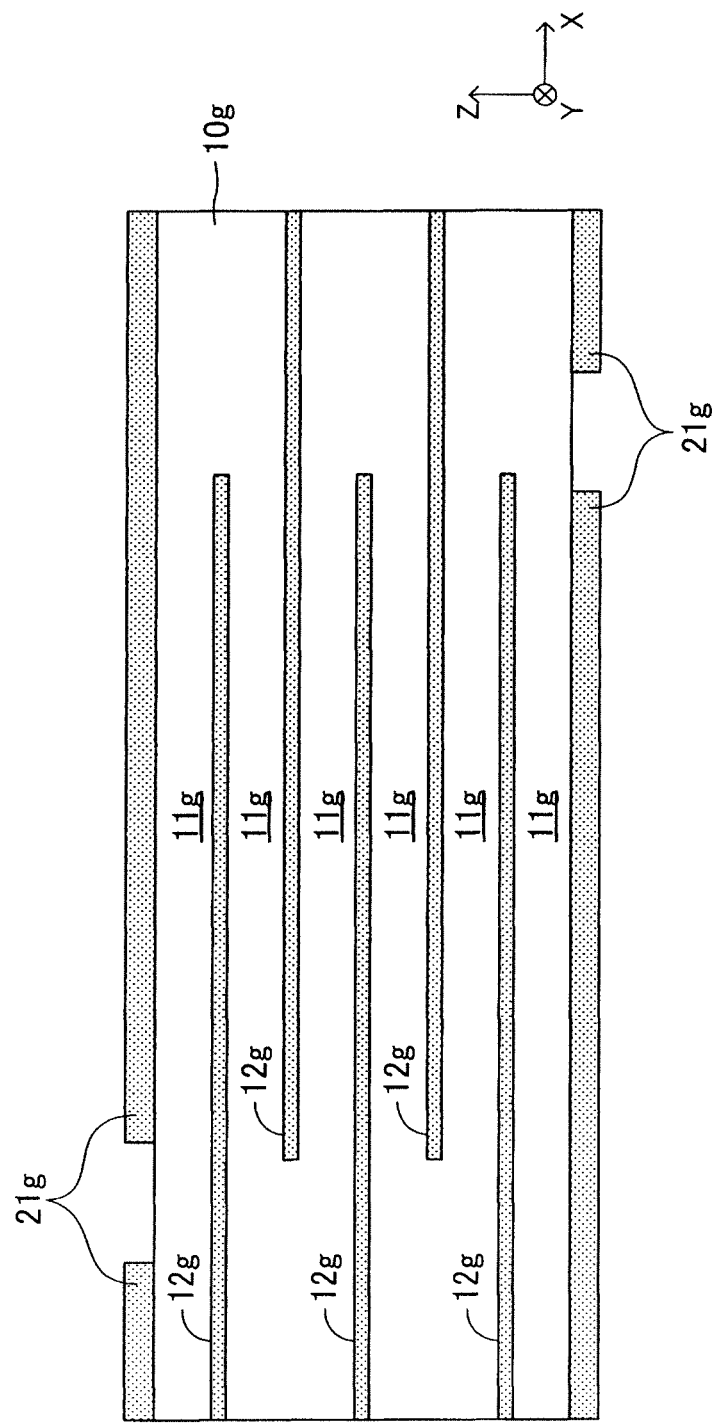
FIG. 8 is a first diagram illustrating the process of manufacturing the piezoelectric device illustrated in FIG. 1.

FIG. 8 illustrates a cross section of one of the extracted green piezoelectric-device-corresponding units, and corresponds to FIG. 2. As illustrated in FIG. 8, in this example, the green piezoelectric-device-corresponding unit includes a green stack 10g corresponding to the body part 10 and green electrode films 21g formed on an upper surface and a lower surface of the green stack 10g and corresponding to the surface electrodes 21. The green stack 10g is a stack of alternating piezoelectric sheets 11g and electrode films 12g having the piezoelectric sheets 11g as an uppermost layer and a lowermost layer.

Next, as illustrated in FIG. 9, green electrode films 22g corresponding to the side electrodes 22 are formed in predetermined portions of side surfaces of the green piezoelectric-device-corresponding unit. In this case, the green electrode films 22g are formed so that the above-mentioned protrusions h are formed in four corner portions of the green stack 10g. The green electrode films 22g are formed by shaping paste containing the electrode material using one of known methods, such as screen printing, spray coating, and ink jet.

The green piezoelectric-device-corresponding unit illustrated in FIG. 9 is fired at a predetermined temperature (e.g., 900° C. to 1200° C.) for a predetermined time period (e.g., a time period for which a maximum temperature is maintained is 0.5 to 3 hours). As a result, the piezoelectric device (after firing) illustrated in FIGS. 1 and 2 is obtained.

In the above-mentioned example, machining is performed with the electrode films 21g formed on the large green stack. As a result, as illustrated in FIG. 8, the electrode films 21g have already been formed on each of the green piezoelectric-device-corresponding units when the green piezoelectric-device-corresponding unit is extracted through machining. Machining, however, may be performed with the electrode films 21g not formed on the large green stack. In this case, the electrode films 21g are formed on each of the green piezoelectric-device-corresponding units after the green piezoelectric-device-corresponding unit is extracted through machining, and then the electrode films 22g can be formed. The electrode films 21g may be formed after the electrode films 22g are formed on each of the green piezoelectric-device-corresponding units.

(Method for Fixing Ceramic Particles P in Inner Regions of Surface Electrodes 21)

A method for fixing the ceramic particles P in the inner regions of the surface electrodes 21 is described next. First, second, and third methods are sequentially described.

<First Method>

The green electrode films 21g corresponding to the surface electrodes 21 are formed using paste of an electrode material containing the ceramic particles P. The formed green electrode films 21g are fired to fix the ceramic particles P onto the surfaces in the inner regions of the surface electrodes 21.

<Second Method>

The green electrode films 21g corresponding to the surface electrodes 21 are formed using paste of an electrode material not containing the ceramic particles P. The ceramic particles P are uniformly sprayed only in portions, of surfaces of the formed green electrode films 21g, corresponding to the "inner regions". The green electrode films 21g onto which the ceramic particles P have been sprayed are fired to fix the ceramic particles P onto the surfaces in the inner regions of the surface electrodes 21. In this method, the portions of the surfaces of the green electrode films 21g onto which the ceramic particles P have been sprayed are preferably pressurized after spraying of the ceramic particles P to increase adhesion of the ceramic particles P to the particles of the electrode material.

<Third Method>

The green electrode films 21g corresponding to the surface electrodes 21 are formed using paste of an electrode material not containing the ceramic particles P. The formed green electrode films 21g are fired. The ceramic particles P are joined only in portions corresponding to the "inner regions" on the surfaces of the surface electrodes 21 formed through firing using a glass joining method. As a result, the ceramic particles P are fixed onto the surfaces in the inner regions of the surface electrodes 21.

(One Example of Assembly of Piezoelectric Device)

Figure 11:
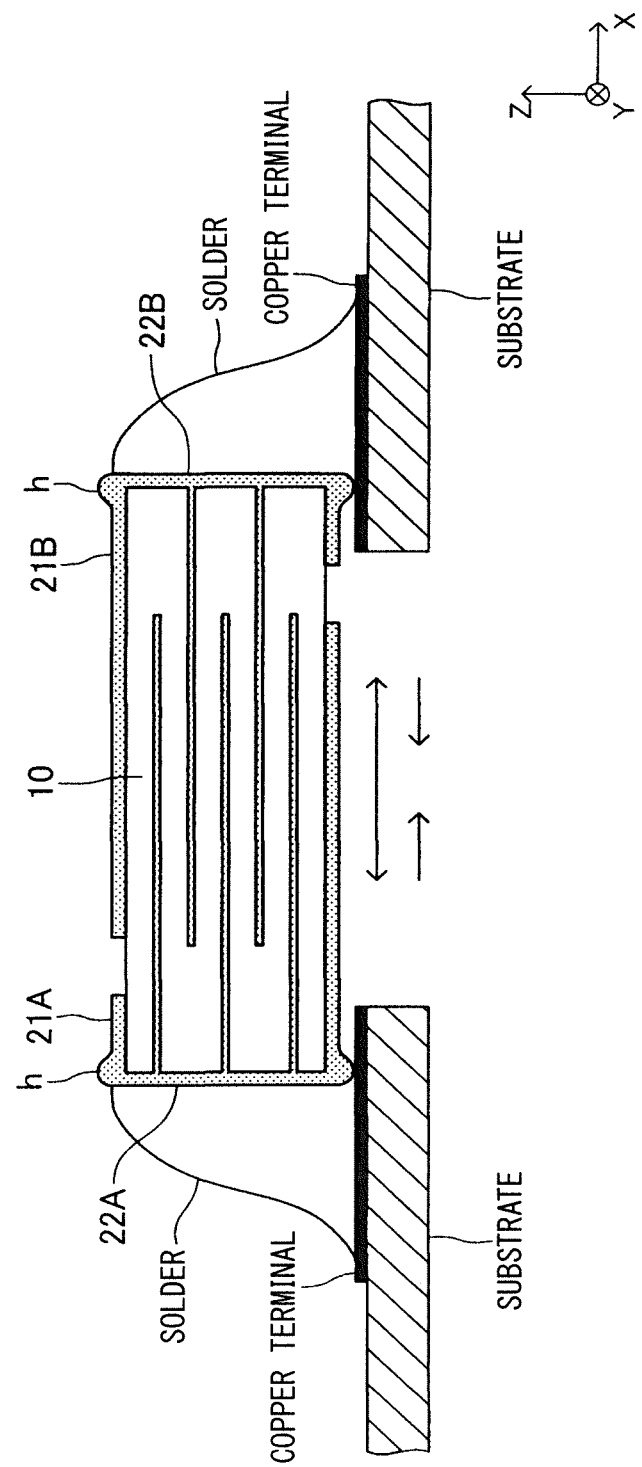
FIG. 11 is a cross sectional view of the "piezoelectric device assembled onto the substrates" illustrated in FIG. 10, and corresponds to FIG. 2.

The piezoelectric device according to the present embodiment described above is assembled onto substrates with solder, for example, as illustrated in FIGS. 10 and 11. In this example, both ends of a lower surface of the piezoelectric device are first placed on upper surfaces (more specifically, upper surfaces of copper terminals provided on the upper surfaces) of opposing ends of a pair of substrates located remotely from each other. Next, in this state, a pair of side electrodes 22A and 22B of the piezoelectric device are joined and secured to the ends of the pair of substrates with solder. Assembly of the piezoelectric device onto the pair of substrates is thus completed.

In the piezoelectric device assembled onto the pair of substrates as described above, the amount of deformation of the piezoelectric layers 11 (i.e., body part 10) changes by changing a potential difference applied across the first and second electrode groups (see arrows shown in FIG. 11). As a result, the distance (interval) between the pair of substrates changes. By using this principle, the piezoelectric device can be used as an actuator for controlling the position of an object, such as an optical lens. Alternatively, in the piezoelectric device assembled onto the pair of substrates as described above, the amount of deformation of the piezoelectric layers 11 (i.e., body part 10) changes by changing the magnitude of force applied to the pair of substrates in a direction in which the distance (interval) between the substrates changes (see the arrows shown in FIG. 11), and the potential difference generated across the first and second electrode groups varies depending on the amount of deformation. By using this principle, the piezoelectric device can be used as various sensors, such as a mass sensor.

(Action and Effects)

Next, the piezoelectric device according to the present embodiment can have the following action and effects when being assembled onto substrates with solder as illustrated in FIGS. 10 and 11. In this case, when too much solder is used, for example, the solder can ride over upper end surfaces of the side electrodes 22A and 22B, and enter surfaces (upper surfaces) of the surface electrodes 21A and 21B as shown by white arrows in FIG. 12. If such an event occurs, expansion and contraction of the surface electrodes 21A and 21B can be restricted at application of voltage to the piezoelectric device due to adherence of the solder to the surfaces of the surface electrodes 21A and 21B, and this can adversely affect "voltage-displacement characteristics" of the piezoelectric device as a whole. Furthermore, if an excessive amount of solder enters the surfaces of the surface electrodes 21A and 21B, the solder can enter a gap (see an insulated region shown in FIG. 12) between the surface electrodes 21A and 21B, resulting in electrical short circuits of the surface electrodes 21A and 21B.

Figure 12:
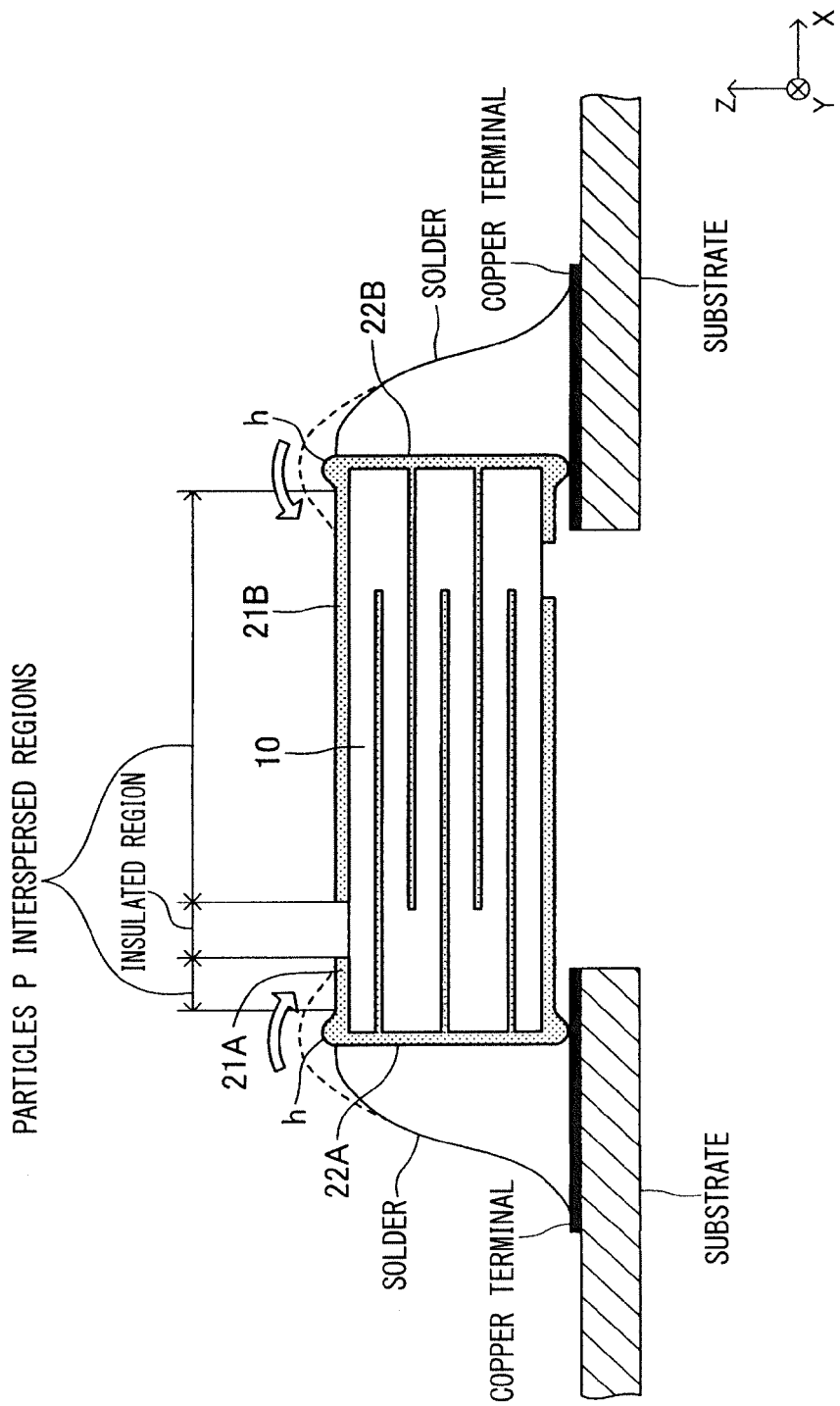
FIG. 12 illustrates the state of solder riding over protrusions and entering "particles P interspersed regions" on surface electrodes, and corresponds to FIG. 11.

In the present embodiment, however, the surfaces of the connection portions where the surface electrodes 21 and the side electrodes 22 are connected to each other have the protrusions h as illustrated in FIG. 12. Thus, when the side electrodes 22 are joined and secured to the substrates with the solder, the solder is less likely to ride over the upper end surfaces of the side electrodes 22, and enter the surfaces (upper surfaces) of the surface electrodes 21 due to the presence of the protrusions h, compared to a case where the protrusions h do not exist.

Even with the presence of the protrusions h, however, the solder can ride over the protrusions h, and enter the surfaces in the above-mentioned "inner regions" (see FIG. 4) of the surface electrodes 21. In the present embodiment, however, as illustrated in FIG. 4, the "inner regions" on the surfaces of the surface electrodes 21 are interspersed with the ceramic particles P having lower solder wettability than the material for the surface electrodes 21 so that the ceramic particles P stick out and are exposed from the surfaces of the surface electrodes 21 (see particles P interspersed regions shown in FIG. 12). Thus, the presence of the ceramic particles P can suppress expansion of a range of wetting of the solder in the "inner regions". As a result, the adverse effects on the "voltage-displacement characteristics" of the piezoelectric device as a whole can be suppressed.

Furthermore, in the present embodiment, the surfaces of the side electrodes 22 are comprised only of the material (typically, platinum) for the side electrodes 22 having relatively high solder wettability. The solder is thus likely to wet on the surfaces of the side electrodes 22. Thus, when the side electrodes 22 are joined and secured to the substrates with the solder as described above, adhesion and bondability of the solder to the side electrodes 22 increase, leading to an increase in reliability concerning electrical connection between the solder and the substrates.

Figure 13:
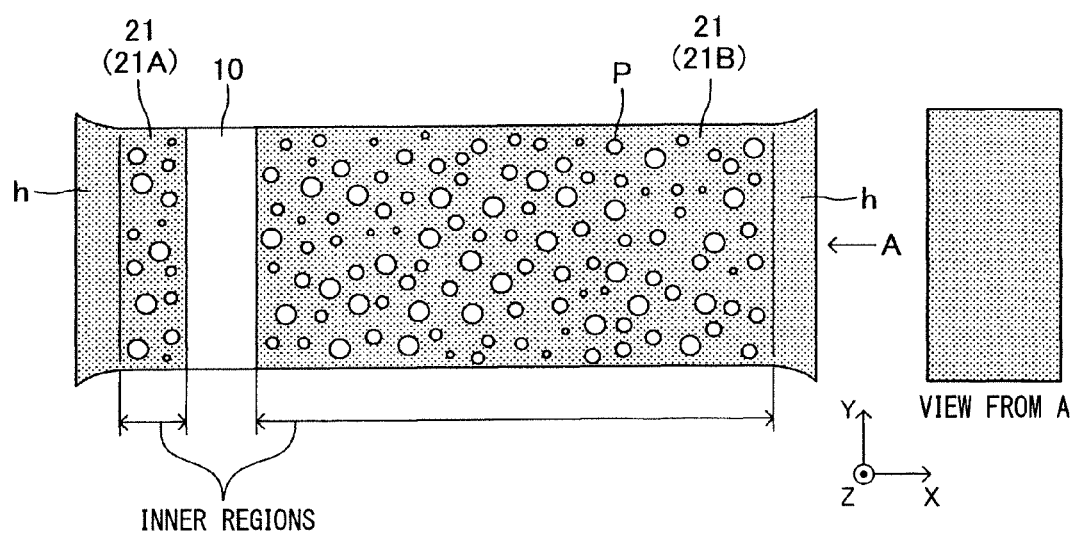
FIG. 13 illustrates a piezoelectric device according to a modification of the embodiment of the present invention, and corresponds to FIG. 4.

In the present embodiment, the depth (length in the y-axis direction) of the side electrodes 22 and the protrusions h can be increased with decreasing distance to the ends of the piezoelectric device in the width direction (x-axis direction) in the top view of the piezoelectric device as illustrated in FIG. 13 by controlling heat contraction characteristics of the material (material having relatively high solder wettability, typically platinum) for the side electrodes 22 and the protrusions h and the body part 10 of the piezoelectric device at firing. This can increase the area of contact between the piezoelectric device and the substrates when the piezoelectric device is assembled onto the substrates. As a result, mechanical strength in connection portions where the piezoelectric device and the substrates are electrically connected to each other can be increased.

Figure 14:
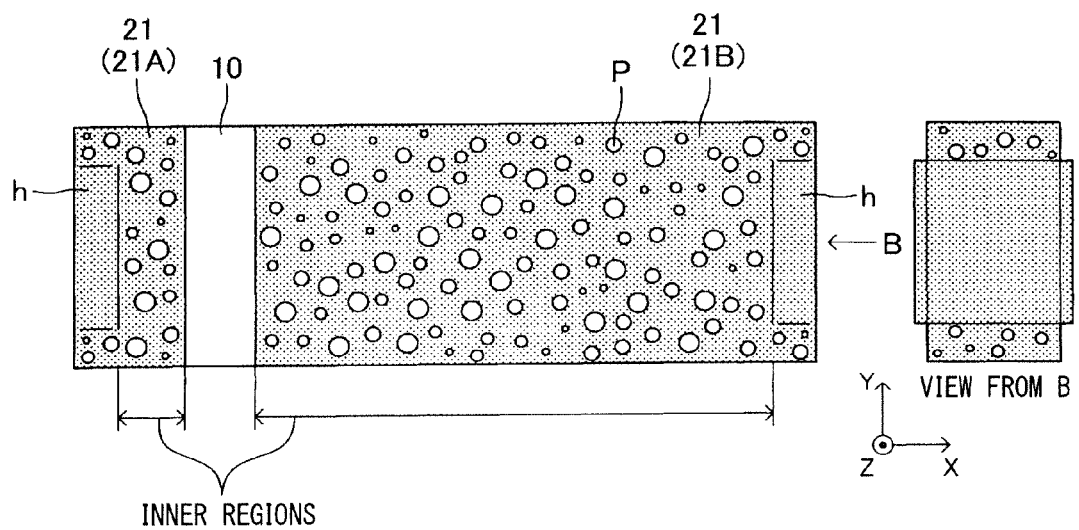
FIG. 14 illustrates a piezoelectric device according to another modification of the embodiment of the present invention, and corresponds to FIG. 4.

As illustrated in FIG. 14, "portions in which surfaces are comprised only of the material (typically, platinum) for the side electrodes 22" of the side electrodes 22 and the protrusions h (having surfaces comprised only of the material (typically, platinum) for the side electrodes 22) may be disposed only in middle portions in the depth direction (y-axis direction) of the piezoelectric device, and "portions in which surfaces of the side electrodes 22 are interspersed with the exposed portions in which the surfaces of the plurality of ceramic particles P are exposed" of the side electrodes 22 may be disposed in both end portions in the depth direction (y-axis direction) of the piezoelectric device. This can suppress electrical short circuits caused by the solder entering a front surface and a back surface of the piezoelectric element when the piezoelectric device is assembled onto the substrates with the solder. In this case, the "portions in which the surfaces are comprised only of the material for the side electrodes 22" of the side electrodes 22 and the protrusions h (having surfaces comprised only of the material for the side electrodes 22) may include a single layer or a plurality of layers including therein a layer containing the ceramic particles.

(Height of Protrusions)

An experiment A conducted to consider an optimal range of the height A (see FIG. 2) of the above-mentioned protrusions h is described next. In this experiment A, samples of the piezoelectric device manufactured using the above-mentioned manufacturing method were used. In each of the samples, the piezoelectric layers 11 each have a thickness of 20.0 µm, the internal electrodes 12 each have a thickness of 2.0 µm, the number of piezoelectric layers 11 is 10, the external electrode 20 (the surface electrodes 21 and the side electrodes 22) has a thickness of 5.0 µm. Each of the samples as a whole has a width of 2.0 mm, a depth of 1.0 mm, and a height of 0.2 mm, and has been fired at a temperature of 1200° C. Each numerical value is a value after firing. Particles of the electrode material (before firing) contained in paste of the surface electrodes each have a diameter of 0.1 µm to 1.0 µm, and particles of the piezoelectric material (before firing) each have a diameter of 0.01 µm to 1.0 µm. Particles of the piezoelectric material contained in the surface electrodes 21 (after firing) each have a diameter of 0.5 µm to 7.0 µm.

As illustrated in FIG. 2 and other drawings, on the surfaces of the "connection portions" (four corner portions of the body part 10) where the surface electrodes 21 and the side electrodes 22 are connected to each other, the protrusions h is provided so as to extend along the direction (y-axis direction) along which the "connection portions" extend and stick out in the thickness direction (z-axis direction) of the surface electrodes 21.

The height A of the protrusions h was adjusted by adjusting the shape of portions corresponding to the protrusions h when the above-mentioned green electrode films 22g (before firing) corresponding to the side electrodes 22 were formed (see FIG. 9). In this experiment A, as the above-mentioned samples, 20 samples were manufactured for each of different heights A of the protrusions h. Each of the samples was assembled onto substrates with solder as illustrated in FIGS. 10 and 11. At assembly, the amount of solder to be used was adjusted to be twice an upper limit of an optimal range of the amount of solder predetermined through various experiments and the like.

A "solder entry ratio" was evaluated for each of the samples based on whether the solder rides over the protrusions h, and enters the surfaces in the above-mentioned "inner regions" (see FIG. 4) of the surface electrodes 21. The "solder entry ratio" refers to a ratio of the "number of samples in which the solder has entered the inner regions" to the "total number of samples" for each height A.

Figure 15:
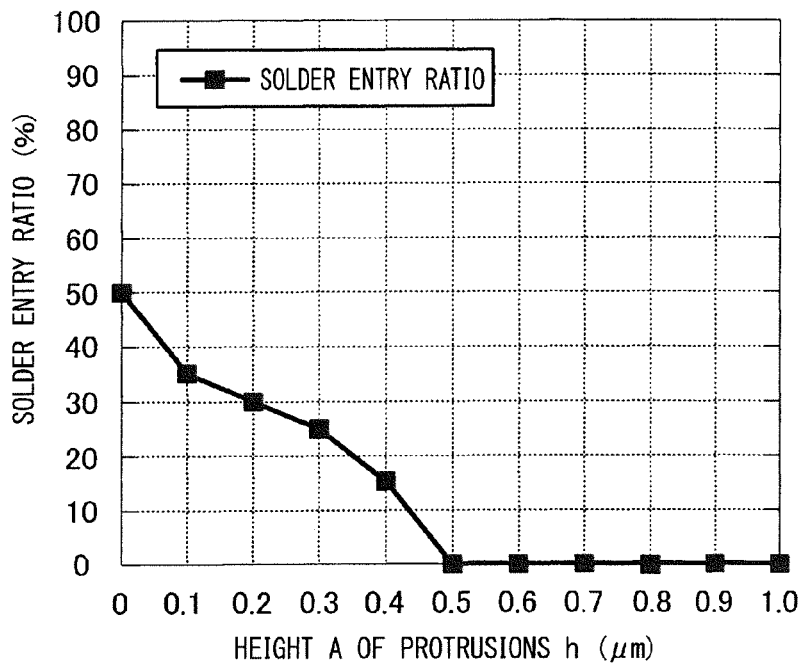
FIG. 15 is a graph showing the relationship of a solder entry ratio to the height of protrusions.

As can be seen from FIG. 15, the solder entry ratio exceeds zero when the height A of the protrusions h is less than 0.5 µm. One the other hand, the solder entry ratio is maintained at zero when the height A of the protrusions h is 0.5 µm or more. The height A of the protrusions h is thus preferably 0.5 µm or more to suppress entry of the solder into the inner regions. An excessive increase in height A of the protrusions h, however, increases a size of the piezoelectric device as a whole. The height A of the protrusions h is thus preferably 8.0 µm or less to suppress an increase in size of the piezoelectric device.

The height A of the protrusions h is thus preferably 0.5 µm to 8.0 µm. The height A of the protrusions h is more preferably 0.5 µm to 6.0 µm or 1.5 µm to 5.0 µm. A ratio (A/B) of the height A to the height B (see FIG. 2) of the piezoelectric device excluding the protrusions h is preferably 1% to 20%.

(Ratio of Area of Exposed Portions of Particles P to Inner Regions)

An experiment B conducted to consider an optimal range of a ratio of the area of the exposed portions of the ceramic particles P to the inner regions is described next. The "ratio of the area of the exposed portions" more accurately refers to a ratio of a "total area of the exposed portions in which the ceramic particles P are exposed" to a "total area of the inner regions of the surface electrodes 21" when the surface electrodes 21 are viewed from a direction (z-axis direction) perpendicular to the surfaces of the surface electrodes 21.

In this experiment B, samples having similar specification to the samples of the piezoelectric device manufactured in the above-mentioned experiment A were manufactured. The surfaces of the "connection portions" (four corner portions of the body part 10) where the surface electrodes 21 and the side electrodes 22 are connected to each other have the protrusions h as in the above-mentioned experiment A. The height A of the protrusions h was adjusted to be in a range of 0.5 µm to 8.0 µm. An average equivalent diameter of the exposed portions was 0.8 µm to 5.0 µm.

The "ratio of the area of the exposed portions" was adjusted by adjusting the diameter of each ceramic particle P and the number of ceramic particles P fixed onto the surfaces of the surface electrodes 21. In this experiment B, as the above-mentioned samples, 20 samples were manufactured for each of different "ratios of the area of the exposed portions". Each of the samples was assembled onto substrates with solder as illustrated in FIGS. 10 and 11. At assembly, the amount of solder to be used was adjusted to be twice an upper limit of an optimal range of the amount of solder predetermined through various experiments and the like to ensure that the solder rides over the protrusions h.

A "solder passage ratio" was evaluated for each of the samples based on whether the solder riding over the protrusions h and entering the surfaces in the "inner regions" (see FIG. 4) of the surface electrodes 21 reaches a reference position 0.1 mm distant from the protrusions h in the inner regions. The "solder passage ratio" refers to a ratio of the "number of samples in which the solder has reached the reference position" to the "total number of samples" for each ratio of the area. In addition, a "displacement amount reduction ratio" was evaluated for each sample. The "displacement amount reduction ratio" refers to a reduction ratio ((a−b)/a) of (b) the amount of displacement of the piezoelectric device at application of reference voltage for each of the samples manufactured in the experiment B to (a) the amount of displacement of the piezoelectric device at application of the reference voltage for a reference sample in which no ceramic particles P exist in the inner regions (i.e., the ratio of the area is zero). The amount of displacement is reduced because expansion and contraction of the surface electrodes 21 are restricted at application of voltage to the piezoelectric device when the surface electrodes 21 contain the ceramic particles or when the surface of the body part 10 is recessed from the surfaces of the surface electrodes 21 and exposed.

Figure 16:
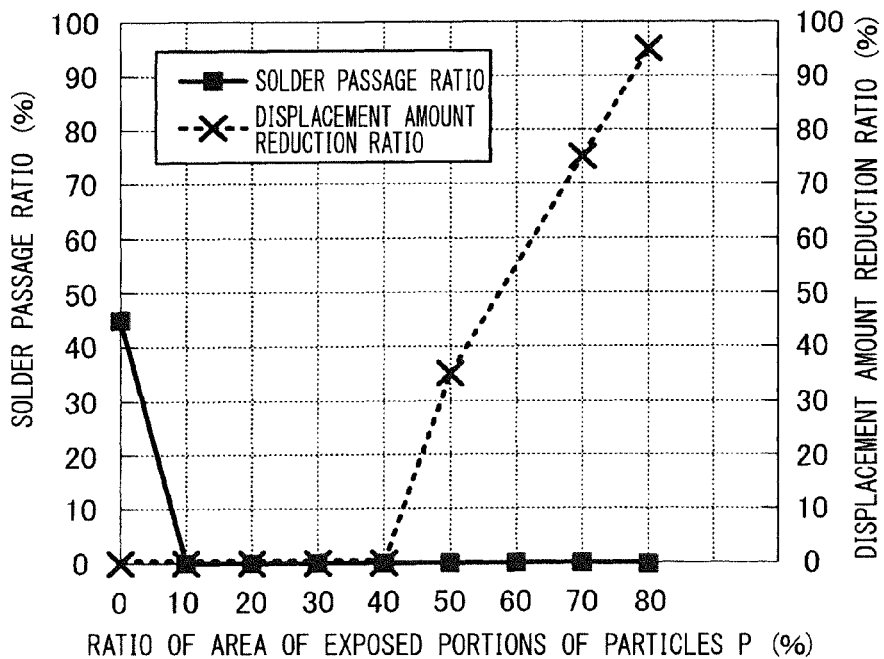
FIG. 16 is a graph showing the relationship of a solder passage ratio and a displacement amount reduction ratio to a ratio of the area of particles P.

As can be seen from FIG. 16, the solder passage ratio exceeds zero when the "ratio of the area of the exposed portions" is less than 10%, and is maintained at zero when the ratio of the area is 10% or more. On the other hand, the displacement amount reduction ratio exceeds zero when the ratio of the area is more than 40%, and is maintained at zero when the ratio of the area is 40% or less. The "ratio of the area of the exposed portions" is thus preferably 10% to 40% to suppress wetting of the solder in the inner regions and to suppress the adverse effects on the "voltage-displacement characteristics". The ratio of the area is more preferably 10% to 35% or 20% to 35%.

(Average Equivalent Diameter of Exposed Portions of Particles P in Inner Regions)

An experiment C conducted to consider an optimal range of an average value of equivalent diameters of the exposed portions of the ceramic particles P in the inner regions is described next. The average equivalent diameter more accurately refers to an average value of equivalent diameters of the "areas of the exposed portions of the ceramic particles P with which the inner regions of the surface electrodes 21 are interspersed" obtained when the surface electrodes 21 are viewed from a direction (z-axis direction) perpendicular to the surfaces of the surface electrodes 21.

In this experiment C, samples having similar specification to the samples of the piezoelectric device manufactured in the above-mentioned experiment A were manufactured as in the above-mentioned experiment B. The surfaces of the "connection portions" (four corner portions of the body part 10) where the surface electrodes 21 and the side electrodes 22 are connected to each other have the protrusions h as in the above-mentioned experiment A. The height A of the protrusions h was adjusted to be in a range of 0.5 µm to 8.0 µm. The "ratio of the area of the exposed portions" was 10% to 40%.

The average equivalent diameter was adjusted by adjusting the diameter of each ceramic particle P fixed onto the surfaces of the surface electrodes 21. In this experiment C, as the above-mentioned samples, 20 samples were manufactured for each of different average equivalent diameters. Each of the samples was assembled onto substrates with solder as illustrated in FIGS. 10 and 11. At assembly, the amount of solder to be used was adjusted to be twice an upper limit of an optimal range of the amount of solder predetermined through various experiments and the like to ensure that the solder rides over the protrusions h. The "solder passage ratio" and the "displacement amount reduction ratio" were evaluated for each sample as in the experiment B.

Figure 17:
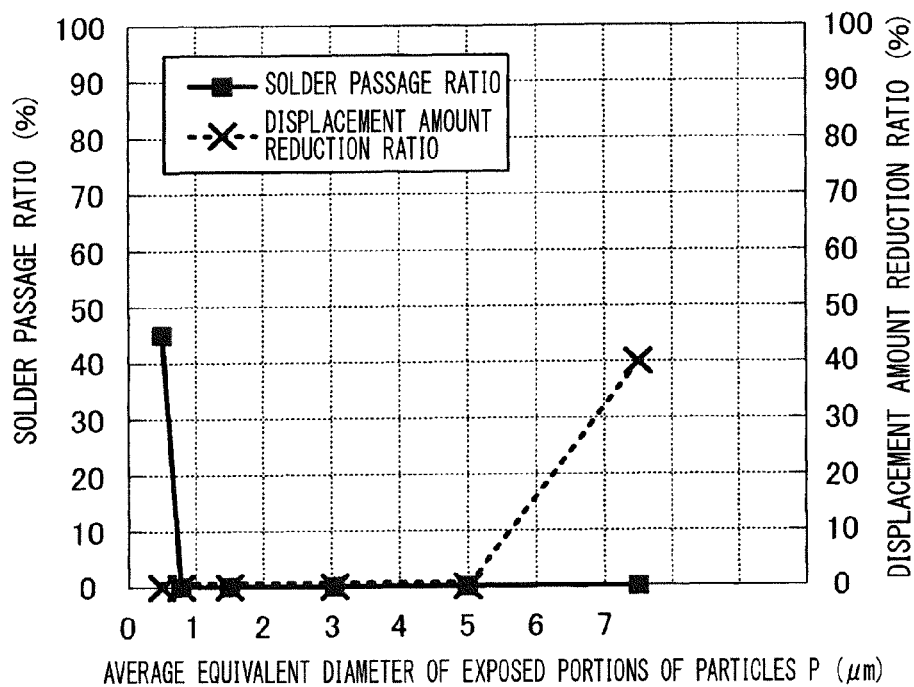
FIG. 17 is a graph showing the relationship of a solder passage ratio and a displacement amount reduction ratio to an average equivalent diameter of particles P.

As can be seen from FIG. 17, the solder passage ratio exceeds zero when the average equivalent diameter is less than 0.8 µm, and is maintained at zero when the diameter is 0.8 µm or more. On the other hand, the displacement amount reduction ratio exceeds zero when the average equivalent diameter is more than 5.0 µm, and is maintained at zero when the diameter is 5.0 µm or less. The average equivalent diameter is thus preferably 0.8 µm to 5.0 µm to suppress wetting of the solder in the inner regions and to suppress the adverse effects on the "voltage-displacement characteristics". The diameter is more preferably 0.8 µm to 3.0 µm or 0.8 µm to 2.0 µm.

Figure 18:
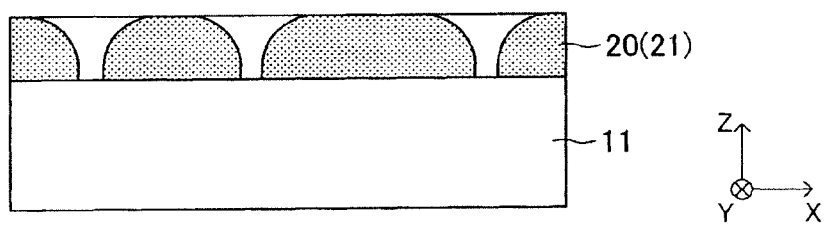
FIG. 18 illustrates a piezoelectric device according to a modification of the embodiment of the present invention, and corresponds to FIG. 3.

The present invention is not limited to the above-mentioned embodiment, and various modifications can be used within a range of the present invention. For example, although the plurality of ceramic particles P stick out and are exposed from the surfaces of the surface electrodes 21 to form the exposed portions as illustrated in FIGS. 3 and 4 in the above-mentioned embodiment, the ceramic material (specifically, the material for the piezoelectric layers 11) may be recessed from the surfaces of the surface electrodes 21 and exposed to form the exposed portions as illustrated in FIG. 18.

Figure 19:
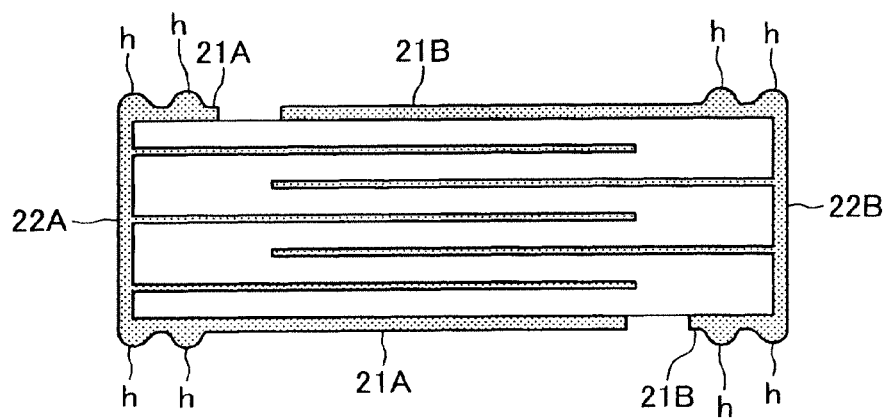
FIG. 19 illustrates a piezoelectric device according to another modification of the embodiment of the present invention, and corresponds to FIG. 2.

Although the "connection portion" where the surface electrode 21 and the side electrode 22 are connected to each other has a single protrusion h at each of four corners of the body part 10 in the above-mentioned embodiment, the "connection portion" where the surface electrode 21 and the side electrode 22 are connected to each other and the surface electrode 21 each may have a single protrusion h at each of the four corners of the body part 10 as illustrated in FIG. 19.

Figure 20:
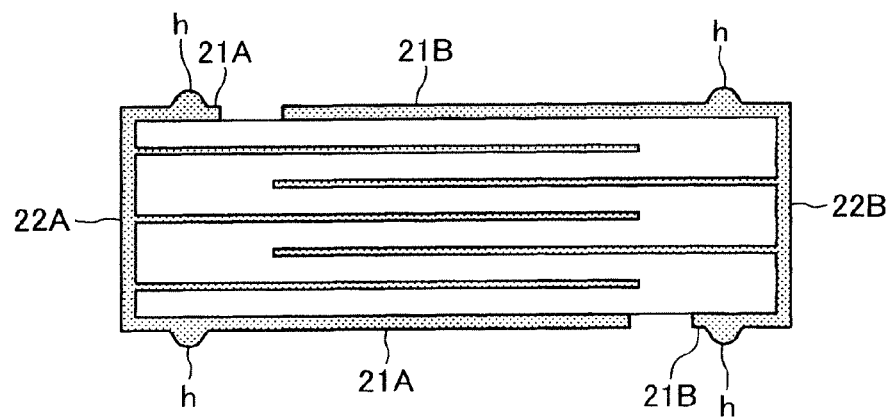
FIG. 20 illustrates a piezoelectric device according to yet another modification of the embodiment of the present invention, and corresponds to FIG. 2.

Although the "connection portion" where the surface electrode 21 and the side electrode 22 are connected to each other has a single protrusion h at each of the four corners of the body part 10 in the above-mentioned embodiment, the surface electrode 21 may have a single protrusion h at each of the four corners of the body part 10 as illustrated in FIG. 20.

Figure 21:
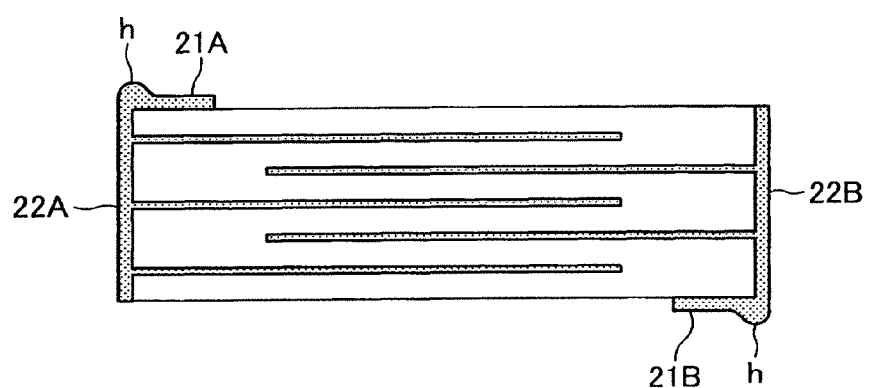
FIG. 21 illustrates a piezoelectric device according to yet another modification of the embodiment of the present invention, and corresponds to FIG. 2.
Figure 22:
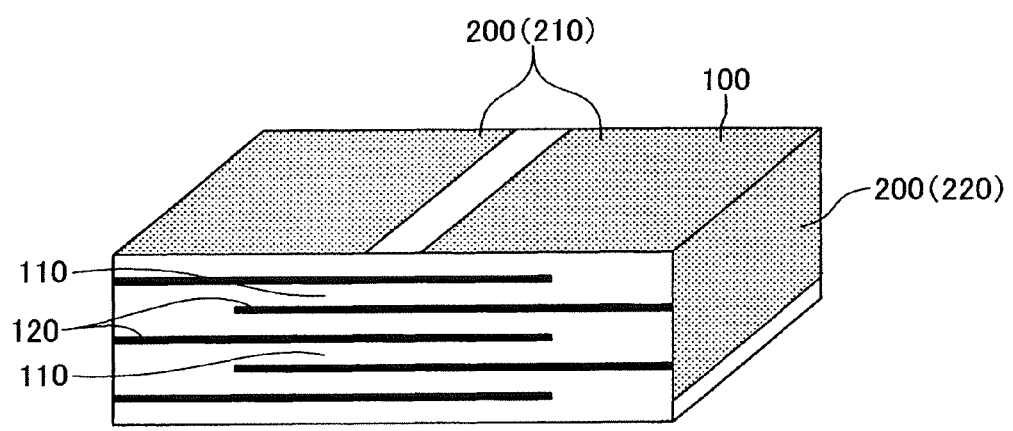
FIG. 22 illustrates a conventional piezoelectric device, and corresponds to FIG. 1.
Figure 23:
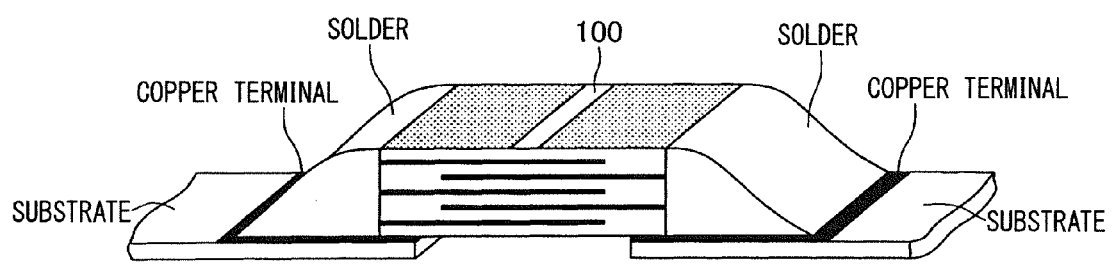
FIG. 23 illustrates the state of the conventional piezoelectric device being assembled onto substrates with solder.
Figure 24:
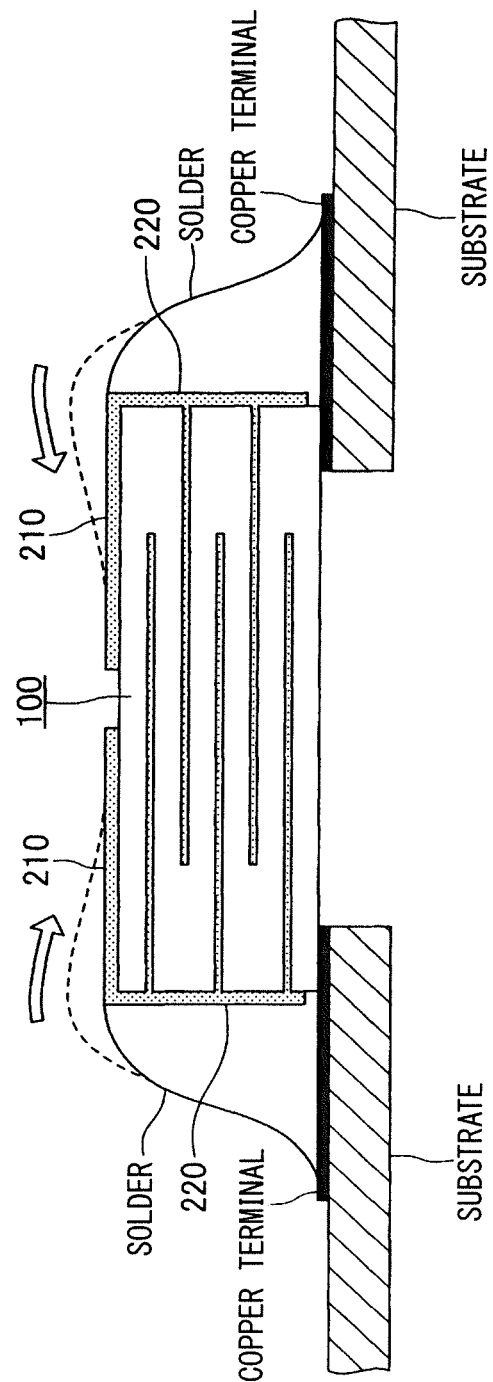
FIG. 24 illustrates the state of solder riding over upper end surfaces of side electrodes and entering surfaces (upper surfaces) of surface electrodes, and corresponds to FIG. 23.

Although the pair of surface electrodes 21A and 21B are provided to each of an upper surface and a lower surface of the piezoelectric device in the above-mentioned embodiment, the surface electrode 21A may be provided to the upper surface of the piezoelectric device only on one side, and the surface electrode 21B may be provided to the lower surface of the piezoelectric device only on the other side as illustrated in FIG. 21.

Although the protrusions h are comprised of the material for the side electrodes 22 (or the surface electrodes 21) in the above-mentioned embodiment, the protrusions h may be comprised of another material (e.g., a resin). In this case, the protrusions are provided after completion of firing of the piezoelectric device as a whole. Although the "solder" is used as the conductive joining material in the above-mentioned embodiment, a conductive joining material other than the "solder" may be used as long as the ceramic material has lower wettability to the conductive joining material than the material for the surface electrodes.

Although the body part 10 is a stack of alternating piezoelectric layers 11 and internal electrodes 12 in the above-mentioned embodiment, the body part 10 may be a piezoelectric body comprised only of the piezoelectric material (including no internal electrodes). The body part 10 may be a ceramic body comprised only of a ceramic material other than the piezoelectric material (including no internal electrodes).

Although the particles of the piezoelectric material are used as the ceramic particles P in the above-mentioned embodiment, ceramic particles of a material other than the piezoelectric material may be used.

The invention claimed is:

1. A ceramic device that is a fired body including a body part and an external electrode, the body part including a portion comprised of a ceramic material, the external electrode being provided on said body part to cover at least part of a surface of said body part, wherein
   said external electrode includes:
      a surface electrode covering at least part of at least one of an upper surface and a lower surface of said body part; and
      a side electrode covering at least part of a side surface of said body part, and being connected to said surface electrode,
   a surface of said side electrode is comprised only of a material for said side electrode,
   on a surface of said surface electrode or a surface of a connection portion where said surface electrode and said side electrode are connected to each other, a protrusion extending along a direction along which said connection portion extends and sticking out in a thickness direction of said surface electrode is provided, and
   a region, on the surface of said surface electrode, farther from said connection portion than said protrusion is interspersed with a plurality of exposed portions in each of which a surface of a ceramic material having lower wettability to a conductive joining material than a material for said surface electrode is exposed.

2. A piezoelectric device that is a fired body including a body part and an external electrode, the body part including a portion comprised of a piezoelectric material, the external electrode being provided on said body part to cover at least part of a surface of said body part, wherein
   said body part is a stack of at least two piezoelectric layers each being comprised of said piezoelectric material and at least one internal electrode,
   said external electrode includes:
      a surface electrode covering at least part of at least one of an upper surface and a lower surface of said body part being said stack; and
      a side electrode covering at least part of a side surface of said body part being said stack, and being connected to said internal electrode and said surface electrode,
   a surface of said side electrode is comprised only of a material for said side electrode,
   on a surface of said surface electrode or a surface of a connection portion where said surface electrode and said side electrode are connected to each other, a protrusion extending along a direction along which said connection portion extends and sticking out in a thickness direction of said surface electrode is provided, and
   a region, on the surface of said surface electrode, farther from said connection portion than said protrusion is interspersed with a plurality of exposed portions in each of which a surface of a ceramic material having lower wettability to a conductive joining material than a material for said surface electrode is exposed.

3. The piezoelectric device according to claim 2, wherein said protrusion has a height of 0.5 µm to 8.0 µm.

4. The piezoelectric device according to claim 2, wherein when said surface electrode is viewed from a direction perpendicular to the surface of said surface electrode, a ratio of a total area of said plurality of exposed portions to a total area of said region, on said surface electrode, farther from said connection portion than said protrusion is 10% to 40%.

5. The piezoelectric device according to claim 2, wherein
when said surface electrode is viewed from a direction perpendicular to the surface of said surface electrode, an average equivalent diameter of each of said plurality of exposed portions is 0.8 μm to 5.0 μm.

6. The piezoelectric device according to claim 2, wherein
the ceramic material for said exposed portions is a piezoelectric material having the same composition as the piezoelectric material contained in said body part.

7. The piezoelectric device according to claim 2, wherein
said surface electrode is comprised of a platinum material, and
said conductive joining material is a solder material.

* * * * *